(12) United States Patent
Valdes et al.

(10) Patent No.: US 10,145,903 B2
(45) Date of Patent: Dec. 4, 2018

(54) METHODS AND SYSTEMS FOR MONITORING DEVICES IN A POWER DISTRIBUTION SYSTEM

(71) Applicant: ABB Schweiz AG, Baden (CH)

(72) Inventors: Marcelo Esteban Valdes, Burlington, CT (US); Thomas Frederick Papallo, Jr., Palm Beach, FL (US); Theodore Drummond Hill, III, West Hartford, CT (US); Jeremy David Smith, West Chester, OH (US)

(73) Assignee: ABB Schweiz AG, Baden (CH)

( * ) Notice: Subject to any disclaimer, the term of this patent is extended or adjusted under 35 U.S.C. 154(b) by 671 days.

(21) Appl. No.: 13/963,642

(22) Filed: Aug. 9, 2013

(65) Prior Publication Data

US 2015/0046122 A1 Feb. 12, 2015

(51) Int. Cl.
| | |
|---|---|
| *G01R 31/40* | (2014.01) |
| *G01R 31/02* | (2006.01) |
| *G01R 31/08* | (2006.01) |
| *G01R 31/12* | (2006.01) |

(52) U.S. Cl.
CPC ........... *G01R 31/40* (2013.01); *G01R 31/024* (2013.01); *G01R 31/086* (2013.01); *G01R 31/12* (2013.01); *Y04S 10/522* (2013.01)

(58) Field of Classification Search
CPC .... G01R 31/024; G01R 31/086; G01R 31/12; G01R 31/40; Y04S 10/522
See application file for complete search history.

(56) References Cited

U.S. PATENT DOCUMENTS

| | | |
|---|---|---|
| 5,224,011 A | 6/1993 | Yalla et al. |
| 6,892,115 B2 | 5/2005 | Berkcan et al. |
| 7,526,402 B2 | 4/2009 | Tanenhaus et al. |
| 7,684,441 B2 | 3/2010 | Bickel et al. |
| 8,127,298 B2 | 2/2012 | Kato et al. |

(Continued)

FOREIGN PATENT DOCUMENTS

| | | |
|---|---|---|
| CN | 102414948 A | 4/2012 |
| CN | 102474130 A | 5/2012 |

(Continued)

OTHER PUBLICATIONS

Kumm et al., "Philosophies for Testing Protective Relays", 48th Annual Georgia Tech Protective Relaying Conference, pp. 1-17, May 1994.

(Continued)

*Primary Examiner* — John Breene
*Assistant Examiner* — Mohammad Islam
(74) *Attorney, Agent, or Firm* — Barnes & Thornburg LLP

(57) ABSTRACT

Methods and systems for monitoring devices in a power distribution system are described. In one example, a method for use in a power distribution system including a plurality of devices is described. The method includes receiving a plurality of data signals associated with the power distribution system, determining a measurement error value associated with the power distribution system based on the plurality of data signals, comparing the determined measurement error value to a dynamic threshold, and generating an alert when the determined measurement error value exceeds the dynamic threshold.

15 Claims, 3 Drawing Sheets

(56) References Cited

U.S. PATENT DOCUMENTS

| | | | |
|---|---|---|---|
| 2003/0058594 A1* | 3/2003 | Kerger | H02H 7/263 361/80 |
| 2005/0273280 A1* | 12/2005 | Cox | G01R 21/133 702/60 |
| 2006/0129339 A1* | 6/2006 | Bruno | G01R 22/10 702/60 |
| 2008/0172192 A1* | 7/2008 | Banhegyesi | G01R 22/10 702/61 |
| 2009/0040666 A1 | 2/2009 | Elms et al. | |
| 2009/0125158 A1* | 5/2009 | Schweitzer, III | G01R 19/2513 700/293 |
| 2010/0060468 A1 | 3/2010 | Elms et al. | |
| 2010/0179780 A1* | 7/2010 | Taft | G01R 19/2513 702/64 |
| 2010/0235122 A1* | 9/2010 | McCrea | G01R 21/06 702/64 |
| 2011/0153236 A1* | 6/2011 | Montreuil | G01R 19/2513 702/59 |

FOREIGN PATENT DOCUMENTS

| | | |
|---|---|---|
| EP | 1 309 979 B1 | 6/2008 |
| JP | 5103428 A | 4/1993 |

OTHER PUBLICATIONS

Kumm et al., "Assessing the Effectiveness of Self-Tests and other Monitoring Means in Protective Relays", Pennsylvania Electric Association Relay Committee Spring Meeting, Matamoras, Pennsylvania pp. 1-14, May, 25-26, 1995.

Valdes et al., "Protection, Control, Reliability and Diagnostic Improvements via Single-Processor Control of Circuit Breakers in Low Voltage Switchgear", Pulp and Paper Industry Technical Conference, Conference Record of the 2004 Annual, Victoria, BC, Canada, IEEE, pp. 146-155, Jun. 27-Jul. 1, 2004.

Nerc, "Protection System Maintenance a Technical Reference", North American Electric Reliability Council, pp. 1-33, Sep. 13, 2007.

Zimmerman et al., "Lessons Learned from Commissioning Protective Relay Systems", Schweitzer Engineering Laboratories, pp. 1-23, 2009.

Zimmerman, "SEL Recommendations on Periodic Maintenance Testing of Protective Relays", Schweitzer Engineering Laboratories (SEL), pp. 1-4, Apr. 2009.

Machine Translation and First Offfice Action and Search issued in connection with corresponding CN Application No. 201410389079.1 dated Aug. 30, 2017.

* cited by examiner

METHODS AND SYSTEMS FOR MONITORING DEVICES IN A POWER DISTRIBUTION SYSTEM

BACKGROUND

The present application relates generally to distribution systems and, more particularly, to methods and systems for monitoring devices in a power distribution system.

Some known power distribution systems include numerous distributed devices, sensors, and one or more controllers. The controllers receive data from the sensors and/or the distributed devices. The received data is used by the controller to control operation of the distribution system.

Maintenance procedures and testing of the components of a power distribution system are commonly performed according to a predetermined maintenance schedule. Manual inspection, measurement, testing, and repair (if applicable) are performed on the control systems of the power distribution system according to the schedule. In between scheduled maintenance procedures, problems may arise with one or more components of the distribution system that are not detected. Such undetected problems can result in inaccurate and/or inefficient operation of the power distribution system. In some circumstances, a component that is only occasionally used may fail or degrade without being detected until the next time that component is used.

BRIEF DESCRIPTION

In one aspect, a method for use in a power distribution system including a plurality of devices is disclosed. The method includes receiving a plurality of data signals associated with the power distribution system, determining a measurement error value associated with the power distribution system based at least in part on the plurality of data signals, comparing the determined measurement error value to a dynamic threshold, and generating an alert when the determined error value exceeds the dynamic threshold.

In another aspect, a controller for a power distribution system includes at least one input for receiving a plurality of data signals associated with the power distribution system, a processor, and a memory device coupled to the processor. The memory device contains executable instructions that, when executed by the processor, cause the controller to: determine a measurement error value associated with the power distribution system based at least in part on the plurality of data signals, compare the determined measurement error value to a dynamic threshold, and generate an alert when the determined error value exceeds the dynamic threshold.

In yet another aspect, a power distribution system includes a plurality of sensors configured to output a plurality of data signals and a controller. The controller includes at least one input for receiving the plurality of data signals from the plurality of sensors, a processor, and a memory device coupled to the processor. The memory device includes executable instructions that, when executed by the processor, cause the controller to: determine a measurement error value associated with at least one sensor based on the plurality of data signals, compare the determined measurement error value to a dynamic threshold, and generate an alert when the determined error value exceeds the dynamic threshold.

DETAILED DESCRIPTION

Exemplary embodiments of methods and systems for monitoring devices in a power distribution system are described herein. The exemplary systems monitor characteristics of the distribution system to detect anomalies within the system that result from, for example, measurement error, improper connection and/or wiring, improper scaling of signals, etc.

Figure 1:
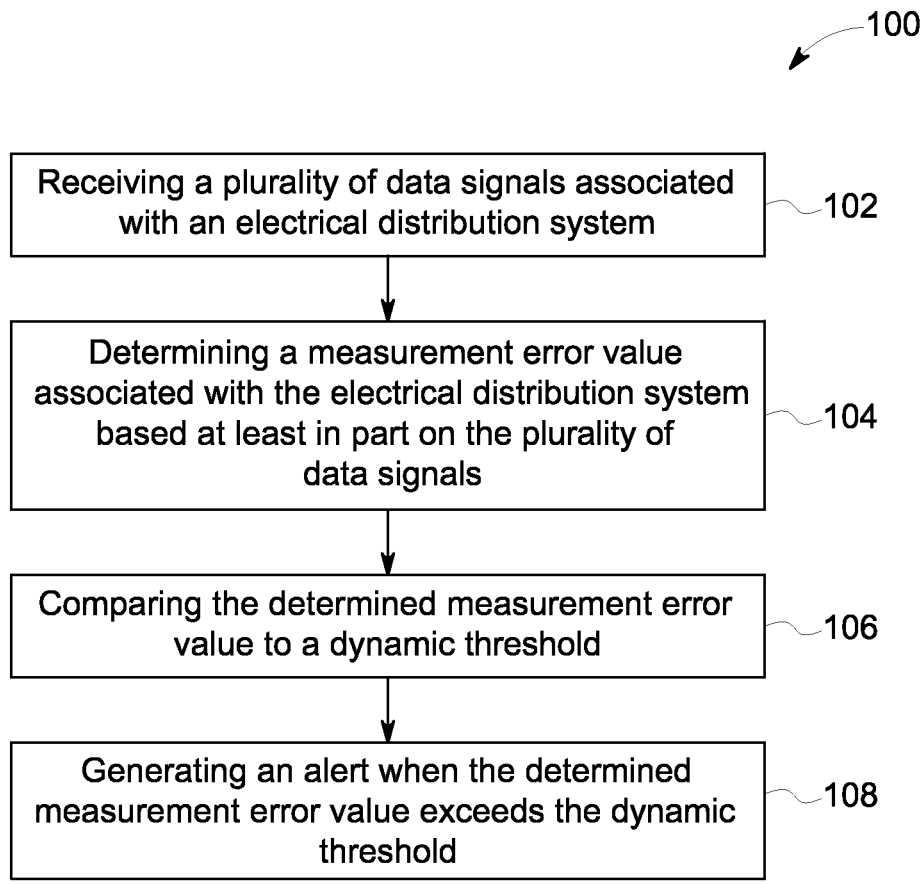
FIG. 1 is a flow diagram of an exemplary method for monitoring a power distribution system.

FIG. 1 is a flow diagram of an exemplary method 100 for use in a power distribution system including a plurality of devices. The plurality of devices includes any devices may include, for example, sensors, circuit protection devices, switches, controllers, etc. The method includes receiving 102 a plurality of data signals associated with the power distribution system. The data signals may include any data signals suitable for use as described herein, including for example, current measurements, temperature measurements, voltage measurements, status signals, etc. The data signals may include real-time signals and/or may be associated with at least one device of the plurality of devices.

A measurement error value associated with the power distribution system is determined 104 based at least in part on the plurality of data signals. The measurement error value is determined by comparative and/or differential calculations performed on more than one data signal. In the exemplary embodiment, the determined measurement error value is not an error value indicating a fault condition and is not used to determine the existence of a fault condition, such as an overcurrent condition, a short circuit, an arc fault, etc. The measurement error value is a value indicative of a non-fault anomaly in the distribution system. The measurement error indicates an incorrect measurement by a sensor or improper functioning of a device in the distribution system. For example, in some embodiments, the measurement error signal is proportional to the sum of current measurement signals for all branches coupled to a single node of the distribution system. Kirchhoff's current law requires that the current entering a node be equal to the current exiting a node, and this example measurement error signal should have a value of zero. If the measurement error value in this example is non-zero, there is a measurement error in the system (i.e., one of the current sensors providing the data signals used for the measurement error calculation is not providing an accurate current measurement). In other embodiments, the determined error value is also used for detecting a fault condition. In some embodiments, the error value is a percentage error based on the value of one or more of the data signals.

The determined measurement error value is compared 106 to a dynamic threshold. This facilitates determining whether or not the determined measurement error value is in excess of an error expected, which indicates that at least one device of the plurality of devices is providing an incorrect signal. The dynamic threshold is variable according to conditions that exist in the system at the time the data signals are generated. The dynamic threshold represents a predetermined probability that the determined measurement error value represents an anomaly in the power distribution system. Thus, when the determined measurement error value exceeds the dynamic threshold, the likelihood that the error value represents an anomaly in the distribution system exceeds the predetermined probability. As used herein, an anomaly associated with the power distribution system does not refer to a system fault (such as an overcurrent condition, overvoltage condition, etc.). Anomalies associated with the system include measurement errors, incorrect signals, incorrect gain settings, etc.

The predetermined probability is fixed in terms of probability, but variable in terms of engineering units. In an example embodiment, the predetermined probability is seventy percent. In other embodiments, any other suitable predetermined probability may be selected. The dynamic threshold varies as a function of the value of one or more of the plurality of data signals. For example, as a value of a data signal increases, the error that is expected in that data signal (such as error due to manufacturing tolerances, etc.) may increase. The dynamic threshold changes according to the value of the data signal, or according to the value of more than one data signal, so that the dynamic threshold maintains a value (in the same units as the error value) that is substantially equivalent to the predetermined probability.

In some embodiments, a probability distribution is determined based, at least in part on the received data signals. The probability distribution represents the probability, for the particular value of one or more inputs, that a determined measurement error is caused by an anomaly in the distribution system. In such embodiments, the dynamic threshold is based on the probability distribution and a fixed probability threshold (e.g., the predetermined probability).

An alert is generated 108 when the determined measurement error value exceeds the dynamic threshold. The alert may be an audible, visual, and/or electronic alert. The alert indicates that an anomaly is likely to exist in the distribution system. In some embodiments, the alert indicates to a user the device associated with the determined measurement error value and that the device may need maintenance. In other embodiments, the data contained in the data signals is subjected to further analysis to determine the cause of the anomaly, the devices affected, and/or suggested courses of action to remedy anomaly.

The method 100 will be further described with reference to current sensors and current measurements by the current sensors in a power distribution system. It should be understood that the techniques described herein, including method 100, may be applied to any other suitable data, any other suitable devices, and in any other suitable system.

Figure 2:
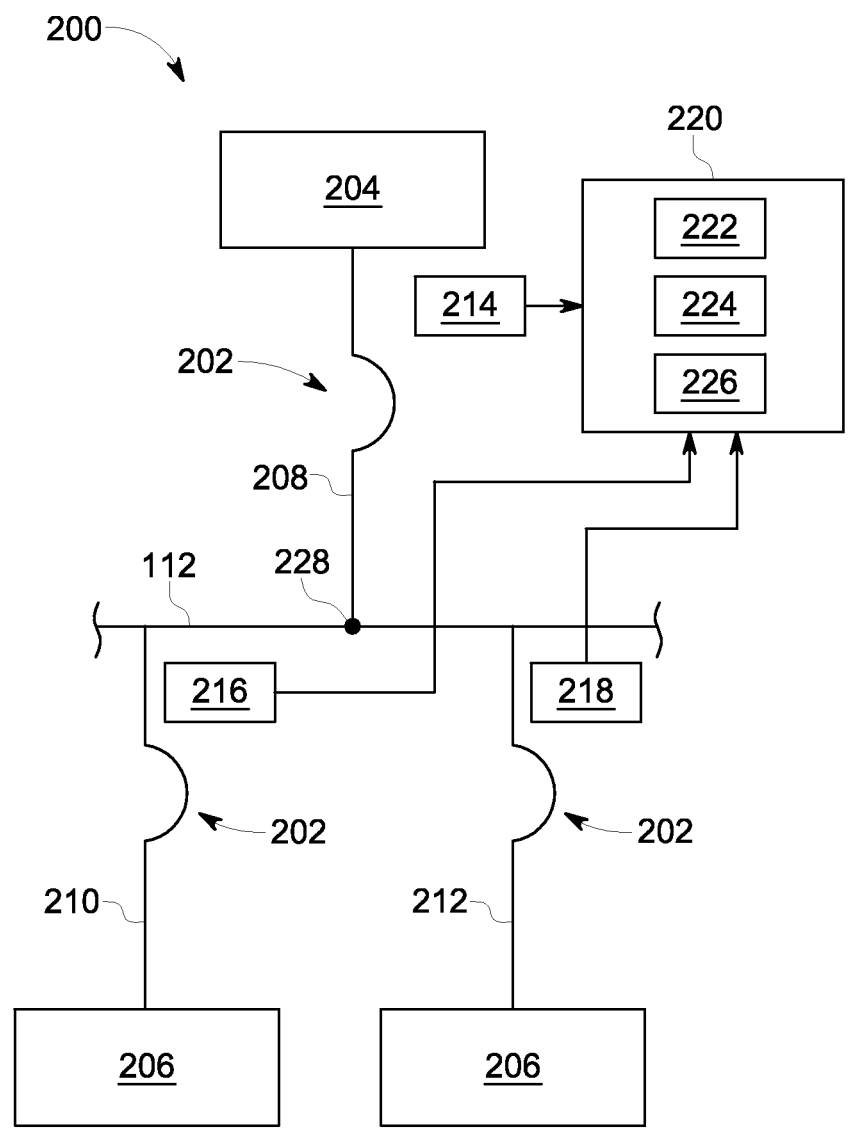
FIG. 2 is a block diagram of a portion of a power distribution system.

FIG. 2 is a block diagram of a portion of an exemplary power distribution system 200. Power distribution system 200 includes a plurality of circuit protection devices 202. Although three circuit protection devices 202 are illustrated in FIG. 2, in other embodiments, power distribution system 200 includes more or fewer circuit protection devices 202. In the exemplary embodiment, circuit protection devices 202 are circuit breakers positioned within one or more switchgear units (not shown). In other embodiments, circuit protection devices 202 are any suitable circuit protection devices positioned in any suitable location and/or enclosure.

Each circuit protection device 202 is configured to programmably control a delivery of power from electrical power source 204 to one or more of loads 206. Electrical power sources 204 may include, for example, one or more generators or other devices that provide electrical current (and resulting electrical power) to loads 206. The electrical current is transmitted from sources 204 to loads 206 through power distribution lines or busses 208, 210, and 212. Loads 206 may include, but are not limited to only including, machinery, motors, lighting, another power distribution network, and/or other electrical and mechanical equipment of a manufacturing or power generation or distribution facility.

Distribution system 200 includes sensors 214, 216, and 218. Sensors 214, 216, and 218 are current sensors configured to monitor current through busses 208, 210, and 212. In other embodiments, sensors 214, 216, and 218 may be any other type of sensor useful in distribution system 200, including for example voltage sensors, temperature sensors, pressure sensors, light sensors, etc. Current sensors 214, 216, and 218 may be any suitable sensor for measuring or detecting electrical current, such as a current transformer, a Rogowski coil, a Hall-effect sensor, a shunt, etc. Each sensor 214, 216, and 218 generates a signal representative of the measured or detected current (hereinafter referred to as "current signal") flowing through a respective distribution bus 208, 210, or 212.

In the exemplary embodiment, distribution system 200 includes a central controller 220. Controller 220 is configured to control circuit protection devices 202 and monitor distribution system 200. More specifically, controller 220 receives current signals from sensors 214, 216, and 218 and controls operation of circuit protection devices 202 based, at least in part, on the received current signals. Control of circuit breakers, such as circuit protection device 202, is well known to those of ordinary skill in the art and will not be discussed further herein. In other embodiments, one or more of the functions described herein as performed by controller 220 are performed by another controller (not shown). For example, in some embodiments, controller 220 is configured to monitor distribution system 200, and one or more other controllers operate protection devices 202.

Controller 220 includes a processor 222, a memory device 224 coupled to the processor 222, and a display device 226. It should be understood that the term "processor" refers generally to any programmable system including systems and microcontrollers, reduced instruction set circuits (RISC), application specific integrated circuits (ASIC), programmable logic circuits, and any other circuit or processor capable of executing the functions described herein. The above examples are exemplary only, and thus are not intended to limit in any way the definition and/or meaning of the term "processor."

Memory 224 stores program code and instructions executable by processor 222 to cause controller 220 to operate as described herein. Memory 224 may include, but is not limited to only include, non-volatile RAM (NVRAM), magnetic RAM (MRAM), ferroelectric RAM (FeRAM), read only memory (ROM), flash memory and/or Electrically Erasable Programmable Read Only Memory (EEPROM). Any other suitable magnetic, optical and/or semiconductor memory, by itself or in combination with other forms of memory, may be included in memory 224. Memory 224 may also be, or include, a detachable or removable memory, including, but not limited to, a suitable cartridge, disk, CD ROM, DVD or USB memory.

Display device 226 displays information, including alerts, to a user. Display device 226 may include, without limitation, a plurality of lights, a monitor, a television display, a plasma display, a liquid crystal display (LCD), a display based on light emitting diodes (LED), a display based on a plurality of organic light-emitting diodes (OLEDs), a display based on polymer light-emitting diodes (PLEDs), a display based on a plurality of surface-conduction electron-emitters (SEDs), a display including a projected and/or reflected image or any other suitable electronic device or display mechanism.

The current signals received by controller 220 from each sensor 214, 216, and 218 will often include a certain amount of error. The error in each signal may be affected by numerous factors, including manufacturing tolerances, signal losses, gain settings, wear and tear on components, etc. The amount of error in two different sensors 214, 216, or 218 may be different even when sensing the same current. Moreover, the amount and/or percentage error for any one sensor 214, 216, or 218 may vary depending on the magnitude of the current that is being sensed. Based on sensor data received from sensors 214, 216, and 218 over a period of time, a distribution of the error in the data signals from each sensor 214, 216, and 218 for various currents is created. Any suitable method of determining the error contribution of each sensor 214, 216, and 218 may be used, including for example, direct measurement, multivariate regression analysis, etc. In the exemplary embodiment, the controller 220 creates the distribution. In other embodiments, any other suitable controller or computing device, including a remote computing device, may analyze the data signals and create the error distribution. Thus, the expected contribution of each sensor 214, 216, and 218 to any detected errors at any current level is known to controller 220. In some embodiments, the error distribution is periodically or continuously updated based on received sensor data.

An example of the calculation of an expected error contribution of one sensor 214, 216, and 218 will now be described. In this example, the sensor 214, 216, or 218 is a current transformer. For a current transformer operating in the linear region, the secondary voltage $V_{sec}$ and the excitation current $I_e$ of the transformer are related by $$V_{sec} = A \cdot I_e^m \tag{1}$$

where A and m are constants that are determined by examining the current transformer's excitation curve. The ideal secondary current of the current transformer is $$\frac{I_1}{CTR} = I_e + I_2 \tag{2}$$

where $I_1/CTR$ is the ideal secondary current, $I_e$ is excitation current, and $I_2$ is the measured secondary current. The secondary voltage $V_{sec}$ may also be determined by $$V_{sec} = I_2(R_{sec} + R_b) \tag{3}$$

where $R_{sec}$ is the CT secondary winding resistance and $R_b$ is the total burden resistance. Combining equations (1) and (3) eliminates $V_{sec}$ and leaves $$I_2(R_{sec} + R_b) = A \cdot I_e^m \tag{4}$$

Analog input error is accounted for by multiplying $I_2$ by an analog error factor $(1+E_a)$, where $E_a$ is typically a few percent under steady state, normal load conditions, transforming equation (4) into $$I_2 \cdot (1+E_a) \cdot (R_{sec} + R_b) = A \cdot I_e^m \tag{5}$$

Solving equation (5) for the excitation current of the transformer yields $$I_e = m\sqrt{\frac{I_2 \cdot (1+E_a) \cdot (R_{sec} + R_b)}{A}} \tag{6}$$

The expected error percentage, referred to as the "node error percentage" is $$NodeErrorPercent = \frac{I_e}{I_e + I_2 \cdot (1+E_a)} \tag{7}$$

Substituting equation (6) into equation 7 results in an error function of $$NodeErrorPercent = \tag{8}$$

$$\frac{I_e}{I_e + I_2 \cdot (1+E_a)} = \frac{m\sqrt{\frac{I_2 \cdot (1+E_a) \cdot (R_{sec} + R_b)}{A}}}{m\sqrt{\frac{I_2 \cdot (1+E_a) \cdot (R_{sec} + R_b)}{A}} + I_2 \cdot (1+E_a)}$$

Multiplying the node error percent by the primary current of the current transformer provides the expected node error in amperes.

A specific example applying the equations derived above will now be described. In this example, the current transformer has a 4000/5 winding turns ratio, a secondary resistance ($R_{sec}$) of 1.475 ohms, a total burden ($R_b$) of 0.001 ohms, and analog input error ($E_a$) of ±2%, and a measured secondary current $I_2$. For this particular current transformer, the excitation curve indicates that A has a value of 45955 and m equals 1.30559. Applying these values to equation (8) produces $$NodeErrorPercent = \tag{9}$$

$$\frac{1.30559\sqrt{\frac{I_2 \cdot (1-0.02) \cdot (1.475-0.001)}{45955}}}{1.30559\sqrt{\frac{I_2 \cdot (1-00.02) \cdot (1.475+0.001)}{45955}} + I_2 \cdot (1-0.02)}$$

For a load current of 500 amperes (A), the secondary current $I_2$ is 625 mA. Plugging this value for $I_2$ into equation (9) produces a node error percent of 0.00041. Multiplying by the 500 A current gives this current transformer's error contribution in amperes as 0.203 A. For a load current of 2500 A, the secondary current $I_2$ is 3.125 A. Plugging this value for $I_2$ into equation (9) produces a node error percent of 0.00028. Multiplying by the 2500 A current gives this current transformer's error contribution in amperes as 0.696 A. For a load current of 4000 A, the secondary current $I_2$ is 5 A. Plugging this value for $I_2$ into equation (9) produces a node error percent of 0.00025. Multiplying by the 4000 A current gives this current transformer's error contribution in amperes as 0.997 A.

When data signals are received from sensors 214, 216, and 218, various mathematical operations are selectively performed to monitor operation of system 200. The calculations result in an error value that controller 220 utilizes in determining whether or not an anomaly has been detected. For example, Kirchhoff's current law requires that the current into a node must equal the current out of that node. Thus, if system 200 is operating without fault, the currents measured by sensors 214, 216, and 218, signed relative to node 228, may be summed by controller 220 and should equal zero. Of course, when using unsigned values, the current out of node 228, represented by the sum of the current detected by sensors 216 and 218, is subtracted from the current into node 228, represented by the current detected by sensor 214. For simplicity, the measured currents will be assumed herein to be signed relative to node 228. The sum of the current signals is more accurately characterized as the sum of the current into node 228, the current out of node 228, the expected measurement error contributed by each sensor node 228, any fault current, and any other error or anomaly affecting the sensor data. Thus, if there is no fault in the portion of system 200 covered by sensors 214, 216, and 218 and no other anomaly, the sum of the data signals from sensors 214, 216, and 218 should equal the sum of the expected measurement error (as given, for example, by the determined error distribution described above). If the sum does not equal the expected measurement error, there is either a fault in system 200 or another anomaly is present. If there is a fault, the fault will typically be much larger than the error and if it exceeds a fault threshold one or more protective measures, such as tripping a circuit breaker, will be initiated. Assuming there is not a fault, the amount by which the sum exceeds the expected measurement error represents an unforeseen error or anomaly. The anomaly may be cause, for example, by degradation of one of sensors 214, 216, and 218, a mis-wiring of one of sensors 214, 216, and 218, a mis-calibration, an erroneous gain setting, an absence of one or more data signal, etc.

Controller 220 compares the determined measurement error value to a dynamic threshold, which is described in more detail below, to determine whether or not to issue an alert indicating that an anomaly is present. More specifically, in the exemplary embodiment, controller 220 determines an error value as an error percentage relative to the inputs that are being monitored. For example, when summing the current signals from sensors 214, 216, and 218 as described above, an error value as a percentage of the measured current is calculated from the non-zero result of the summation. The currents measured by sensors 214, 216, and 218 are summed and the result is divided by the total unsigned current measured by sensors 214, 216, and 218 to produce an error percentage. Alternatively, or additionally, the error percentage may be a function of data from a different sensor or less than all of sensors 214, 216, and 218. For example the error percentage may be calculated as a percentage of the input current, i.e. the current measured by sensor 214.

Figure 3:
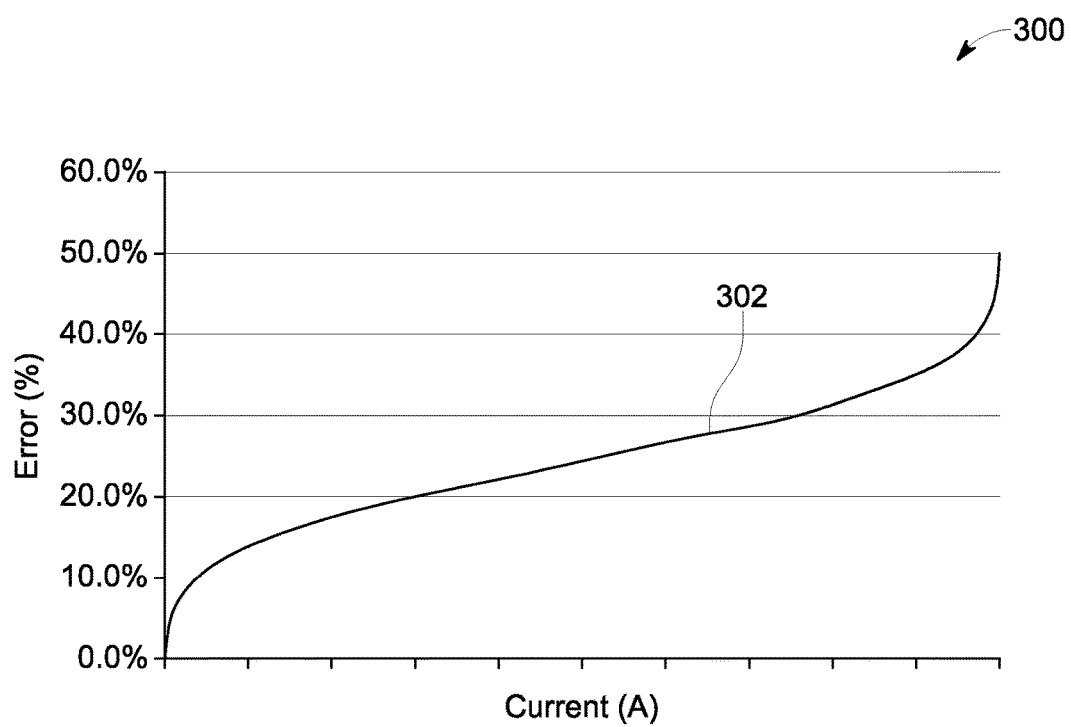
FIG. 3 is a graphical representation of a dynamic threshold for an error percentage as a function of current.

The dynamic threshold represents a predetermined probability that an error value indicates an anomaly such that an alarm should be indicated. In probabilistic units, the predetermined threshold is fixed. In engineering units, such as amperes, volts, etc., the predetermined threshold varies, resulting in a dynamic threshold. FIG. 3 is a graphical representation 300 of an example dynamic threshold 302 as a function of current for use with system 200. In this example, the predetermined threshold is seventy percent. As can be seen, dynamic threshold 302 varies as the current changes. The input current is the current on which the error percentage is based. Thus, in this example, the input current is the total unsigned current measured by sensors 214, 216, and 218. For all of the values of the input current, dynamic threshold 302 represents the error value at which there is a seventy percent chance that the error value is not within the expected error distribution. Controller 220 compare the determined error percentage to the dynamic threshold at the value of the input current used to determine the error percentage. If the determined error percentage equals or exceeds the dynamic threshold, controller 220 issues an alert. The alert indicates to a user that a likely anomaly has been detected. The user may then investigate further to determine the cause of the anomaly and perform repairs, as and if needed, to remove cure anomaly. In some embodiments, controller 220 performs additional checks after detecting a likely anomaly to identify the specific cause of the anomaly, and reports the result of the additional checks. In some embodiments, the alert is provided to a remote computing device that may perform additional calculations and checks to identify the cause of the anomaly.

The dynamic threshold is determined based on the error distributions described above. The error distributions indicate, for each sensor 214, 216, and 218, the expected error. The error distributions for each sensor 214, 216, and 218 are combined to create an expected error distribution for the current measurements with respect to node 228. A probability distribution is calculated to determine the probabilities of a calculated error falling within the expected error distribution for any given input value (e.g., the total current). Any suitable statistical techniques may be used to create the probability distribution. In the exemplary embodiment, controller 220 creates the error distributions and the probability distribution. In other embodiments, a different controller or computing device determines the error distributions and/or the probability distribution. The dynamic threshold is determined from the probability distribution. For any input values, the dynamic threshold is the error value at which the probability distribution indicates a probability of the error value being outside of the expected error distribution equal to the predetermined threshold. In the exemplary embodiment, the predetermined threshold is fixed. In other embodiments, the predetermined threshold may variable and/or be selected by a user.

In the exemplary embodiment, controller 220 determines the error value and compares it to the dynamic threshold automatically on a periodic basis. The period may be any suitable period, such as every minute, every hour, every day, every week, etc. In other embodiments, the controller 220 continuously determines the error value and compares it to the dynamic threshold. In some embodiments, a user may, additionally or alternatively, initiate calculation of the error value and comparison to the dynamic value.

A technical effect of the methods and systems described herein may include one or more of: (a) receiving a plurality of data signals associated with a power distribution system; (b) determining a measurement error value associated the power distribution system based at least in part on the plurality of data signals; (c) comparing the determined measurement error value to a dynamic threshold; and (d) generating an alert when the determined measurement error value exceeds the dynamic threshold.

Exemplary embodiments of power distribution systems and methods of operating a power distribution system are described above in detail. The systems and methods are not limited to the specific embodiments described herein but, rather, components of the systems and/or operations of the methods may be utilized independently and separately from other components and/or operations described herein. Further, the described components and/or operations may also be defined in, or used in combination with, other systems, methods, and/or devices, and are not limited to practice with only the power system as described herein.

The order of execution or performance of the operations in the embodiments are illustrated and described herein is not essential, unless otherwise specified. That is, the operations may be performed in any order, unless otherwise specified, and embodiments may include additional or fewer operations than those disclosed herein. For example, it is contemplated that executing or performing a particular operation before, contemporaneously with, or after another operation is within the scope of aspects of this disclosure.

Although specific features of various embodiments of the may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method for identifying non-fault anomaly in a power distribution system including a plurality of circuit protection devices and sensors, said method comprising:
   receiving, by a controller, a plurality of data signals from a plurality of current sensors associated with the power distribution system, wherein each data signal of the plurality of data signals represents an electrical current measured between electrical nodes of the power distribution system by a respective current sensor of the plurality of current sensors;
   summing, by the controller, for a first node of the power distribution system, and based on the received plurality of data signals, electrical current into and out of the first node;
   if the electrical current summation of the first node does not equal an expected measurement error value, comparing, by the controller, the electrical current summation of the first node with a fault threshold;
   tripping, by the controller, one or more circuit breakers if the electrical current summation of the first node exceeds the fault threshold;
   if the electrical current summation is less than the fault threshold and above the expected measurement error value, determining, by the controller, a measurement error value associated with the power distribution system as a ratio of the electrical current summation of the first node to a value of one or more of the plurality of data signals;
   determining, by the controller, a dynamic threshold, wherein:
      (i) the dynamic threshold represents a threshold measurement error value associated with a predetermined fixed probability of the non-fault anomaly, and
      (ii) a value of the dynamic threshold varies as a function of a value of at least one of the plurality of data signals;
   comparing, by the controller, the determined measurement error value to the dynamic threshold;
   identifying, by the controller, at least one of the plurality of circuit protection devices and sensors affected by the non-fault anomaly when the determined measurement error value exceeds the dynamic threshold; and
   activating, by the controller, an alert when the determined measurement error value exceeds the dynamic threshold to enable a user to investigate a cause of the non-fault anomaly and the at least one of the plurality of circuit protection devices and sensors affected by the non-fault anomaly, wherein the alert includes at least one of a visible alert and an audible alert.

2. A method in accordance with claim 1, further comprising determining, based at least in part on the plurality of data signals, a probability distribution of the probability that an error is caused by a non-fault anomaly in the distribution system.

3. A method in accordance with claim 2, further comprising determining the dynamic threshold based at least in part on a fixed probability threshold and the probability distribution.

4. A method in accordance with claim 1, wherein receiving a plurality of data signals comprises receiving a plurality of data signals including real-time data signals.

5. A method in accordance with claim 1, further comprising:
   analyzing the plurality of data signals when the determined measurement error value exceeds the dynamic threshold; and
   determining, by the controller, at least one of the cause of the non-fault anomaly and a recommended course of action to remedy the non-fault anomaly based on the analysis.

6. A method in accordance with claim 1, further comprising replacing at least one component of the power distribution system in response to the alert.

7. A controller for a power distribution system including a plurality of circuit protection devices and sensors, said controller comprising:
   at least one input for receiving a plurality of data signals from a plurality of current sensors of the power distribution system, wherein each data signal of the plurality of data signals represents an electrical current measured at a node of the power distribution system by a respective current sensor of the plurality of current sensors,
   a processor; and
   a memory device coupled to said processor, said memory device containing executable instructions that, when executed by said processor, cause the controller to:
      sum, by the controller, for a first node of the power distribution system, and based on the received plurality of data signals, electrical current into and out of the first node;
      if the electrical current summation of the first node does not equal an expected measurement error value, compare, by the controller, the electrical current summation of the first node with a fault threshold;
      trip, by the controller, one or more circuit breakers if the electrical current summation of the first node exceeds the fault threshold;
      if the electrical current summation is less than the fault threshold and above the expected measurement error value, determine, by the controller, a measurement error value associated with the power distribution system as a ratio of the electrical current summation of the first node to a value of one or more of the plurality of data signals;
      determine a dynamic threshold, wherein:
         (i) the dynamic threshold represents a threshold measurement error value associated with a predetermined fixed probability of a non-fault anomaly, and
         (ii) a value of the dynamic threshold varies as a function of a value of at least one of the plurality of data signals;
      compare the determined measurement error value to the dynamic threshold;

identify at least one of the plurality of circuit protection devices and sensors affected by the non-fault anomaly when the determined measurement error value exceeds the dynamic threshold; and activate an alert when the determined measurement error value exceeds the dynamic threshold to enable a user to investigate a cause of the non-fault anomaly and the at least one of the plurality of circuit protection devices and sensors affected by the non-fault anomaly, wherein the alert includes at least one of a visible alert and an audible alert.

8. A controller in accordance with claim 7, wherein said memory device contains executable instructions that further cause the controller to determine, based at least in part on the plurality of data signals, a probability distribution of the probability that an error is caused by a non-fault anomaly in the distribution system.

9. A controller in accordance with claim 8, wherein said memory device contains executable instructions that further cause the controller to determine the dynamic threshold based at least in part on a fixed probability threshold and the probability distribution.

10. A controller in accordance with claim 7, wherein the plurality of data signals comprise real-time data signals.

11. A. controller in accordance with claim 7, wherein said memory device contains executable instructions that further cause the controller to:
analyze the plurality of data signals when the determined measurement error value exceeds the dynamic threshold; and
determine at least one of the cause of the non-fault anomaly and a recommended course of action to remedy the non-fault anomaly based on the analysis.

12. A power distribution system comprising:
a plurality of current sensors configured to output a plurality of data signals, each data signal of the plurality of data signals representing an electrical current measured at a node of the power distribution system by a respective current sensor of the plurality of current sensors; and
a controller comprising:
at least one input for receiving the plurality of data signals from said plurality of current sensors;
a processor; and
a memory device coupled to said processor, said memory device containing executable instructions that, when executed by said processor, cause the controller to:
sum, by the controller, for a first node of the power distribution system, and based on the received plurality of data signals, electrical current into and out of the first node;
if the electrical current summation of the first node does not equal an expected measurement error value, compare, by the controller, the electrical current summation of the first node with a fault threshold;
trip, by the controller, one or more circuit breakers if the electrical current summation of the first node exceeds the fault threshold;
if the electrical current summation is less than the fault threshold and above the expected measurement error value, determine, by the controller, a measurement error value associated with at least one sensor as a percentage of a value of one or more of the plurality of data signals;
determine a dynamic threshold, wherein:
(i) the dynamic threshold represents a threshold measurement error value associated with a predetermined fixed probability of a non-fault anomaly, and
(ii) a value of the dynamic threshold varies as a function of a value of at least one of the plurality of data signals;
compare the determined measurement error value to the dynamic threshold;
identify at least one of said plurality of current sensors affected by the non-fault anomaly when the determined measurement error value exceeds the dynamic threshold; and
activate an alert when the determined measurement error value exceeds the dynamic threshold to enable the user to investigate a cause of the non-fault anomaly and the at least one of said plurality of current sensors affected by the non-fault anomaly, wherein the alert includes at least one of a visible alert and an audible alert.

13. A power distribution system in accordance with claim 12, wherein said memory device contains executable instructions that further cause said controller to determine, based at least in part on the plurality of data signals, a probability distribution of the probability that an error is caused by a non-fault anomaly in the distribution system.

14. A power distribution system in accordance with claim 12, wherein said memory device contains executable instructions that further cause said controller to determine the dynamic threshold based at least in part on a fixed probability threshold and the probability distribution.

15. A power distribution system in accordance with claim 12, wherein said memory device contains executable instructions that further cause said controller to:
analyze the plurality of data signals when the determined measurement error value exceeds the dynamic threshold; and
determine at least one of the cause of the non-fault anomaly and a recommended course of action to remedy the non-fault anomaly based on the analysis.

* * * * *